(12) United States Patent  
Volkerink et al.

(10) Patent No.: US 7,743,304 B2  
(45) Date of Patent: Jun. 22, 2010

(54) TEST SYSTEM AND METHOD FOR TESTING ELECTRONIC DEVICES USING A PIPELINED TESTING ARCHITECTURE

(75) Inventors: Erik H. Volkerink, San Jose, CA (US); Edmundo De La Puente, Cupertino, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 261 days.

(21) Appl. No.: 11/357,480

(22) Filed: Feb. 17, 2006

(65) Prior Publication Data

US 2007/0198881 A1    Aug. 23, 2007

(51) Int. Cl.
  *G06F 11/00* (2006.01)
  *G01R 31/28* (2006.01)
(52) U.S. Cl. ............... 714/738; 714/724; 714/736; 714/742
(58) Field of Classification Search ............ 714/724, 714/726, 733, 736
See application file for complete search history.

(56) References Cited

U.S. PATENT DOCUMENTS

| 5,235,271 | A | 8/1993 | Kira |
| 5,341,091 | A | 8/1994 | Kurita |
| 6,067,262 | A * | 5/2000 | Irrinki et al. ............... 365/201 |
| 6,671,844 | B1 * | 12/2003 | Krech et al. ............... 714/736 |
| 6,779,140 | B2 * | 8/2004 | Krech et al. ............... 714/718 |
| 6,988,232 | B2 * | 1/2006 | Ricchetti et al. ........... 714/736 |
| 7,042,243 | B2 * | 5/2006 | Matsumoto ................. 324/763 |
| 7,131,046 | B2 * | 10/2006 | Volkerink et al. .......... 714/732 |
| 2003/0005375 | A1 | 1/2003 | Krech et al. |
| 2004/0107395 | A1 * | 6/2004 | Volkerink et al. .......... 714/732 |

FOREIGN PATENT DOCUMENTS

WO    WO 99/23499 A    5/1999

OTHER PUBLICATIONS

PCT International Search Report and Written Opinion Dated Jul. 18, 2007 for International Application No. PCT/EP2007/001376.

* cited by examiner

*Primary Examiner*—Kevin L Ellis  
*Assistant Examiner*—Daniel F McMahon  
(74) *Attorney, Agent, or Firm*—Holland & Hart, LLP (57) ABSTRACT

A test system for performing tests on devices under test (DUTs) includes a storage device storing test data for performing the tests on the DUTs, a shared processor for generating the test data, storing the test data in the storage device and generating a test control signal including one or more test instructions for executing the tests, and, for each DUT, a dedicated processor configured to receive a test control signal from the shared processor, and in response to the test control signal, transfer the test data for one of the test instructions to the DUT to execute that test instruction and verify the completion of that test instruction.

20 Claims, 4 Drawing Sheets

TEST SYSTEM AND METHOD FOR TESTING ELECTRONIC DEVICES USING A PIPELINED TESTING ARCHITECTURE

BACKGROUND OF THE INVENTION

As electronic devices continue to reach higher levels of performance through among others shrinking feature sizes, greater integration and higher clock frequencies, manufacturers of testing devices have struggled to improve automatic test equipment (ATE) tester performance while also scaling the cost of the improved ATE testers with the technology. For example, ATE testers typically include hundreds or even thousands of test contacts or pins to test multiple devices under test (DUTs) in parallel. Each pin is connected to provide stimulus to a DUT and/or to receive a response of the DUT to the stimulus. One or more test resources, such as pattern generators, are connected to the pins to generate the stimulus and/or process the test results.

Traditionally, there has been a trade-off between the throughput achievable by the ATE testers and the cost of the ATE tester. For example, the cost of the ATE tester typically increases with the number and complexity of test resources. Therefore, to reduce the cost of ATE testers, a shared ATE architecture is commonly used to connect a single test resource, such as a pattern generator, to multiple DUTs. During testing, the pattern generator generates and simultaneously broadcasts a common test signal to each of the DUTs.

However, the test time for executing a particular test may vary between the DUTs in the batch of DUTs simultaneously tested by the ATE tester. Thus, in many testing applications, the test resource is required to poll the DUTs for confirmation that all of the DUTs have finished executing the current test before beginning the next test. Since a shared architecture requires that the test signal be synchronously broadcast to the DUTs, the test resource is unable to broadcast the next test signal until all DUTs indicate they are ready to receive the next test signal. For example, even if a particular DUT is ready to receive the next test signal in the current clock cycle, the test resource may be required to wait one or more additional clock cycles until all DUTs are ready to receive the next test signal before the test resource can transmit the next test signal to the DUTs.

Thus, a shared architecture may result in under-utilization of test resources, thereby decreasing test throughput. In addition, the test resource is usually capable of responding to only one DUT interrupt at a time. Therefore, test throughput in shared architectures is also adversely affected by the inability of the test resource to quickly respond to interrupts from DUTs.

An alternative to the shared resource architecture is a "per site" architecture, in which each DUT is tested by a dedicated test resource. Although the "per site" architecture significantly improves the throughput of the ATE tester, the increased cost associated with multiple test resources usually limits the benefits provided by the increase in test throughput. In addition, the normally high throughput of current "per site" testers is deteriorating due to the increased prevalence of varying pin counts in DUTs. For example, if a 32 pin-count tester resource is used to test an 8 pin-count DUT, under-utilization of pin resources occurs (i.e., only 25% of the pins are utilized). To limit the impact, the 32-pin count test resource can be used as a shared resource to simultaneously test four DUTs. However, this may result in the same under-utilization as the shared architecture discussed above.

In addition, some test systems require advanced algorithms for performing tasks related to testing, such as responding to DUT interrupts and repairing DUTs. These advanced processing algorithms are normally implemented in a master work station that is in communication with multiple test resources. As such, there is an added delay introduced by forwarding interrupts and repair requests to the work station and waiting for instructions from the work station. This added delay increases the latency of the test system, which effectively decreases the test throughput.

Therefore, what is needed is an ATE architecture that maximizes throughput while minimizing cost.

SUMMARY OF THE INVENTION

Embodiments of the present invention provide a test system for testing devices under test (DUTs) that allows for a high throughput and a low capital expenditure cost. The test system includes a storage device storing test data for performing the tests on the DUTs, a shared processor for generating the test data, storing the test data in the storage device and generating a test control signal including one or more test instructions for executing the tests and, for each DUT, a dedicated processor configured to receive a test control signal from the shared processor, and in response to the test control signal, transfer the test data for one of the test instructions to the DUT to execute that test instruction and verify the completion of that test instruction.

In one embodiment, the dedicated processor is further operable to receive output data from the DUT by polling or interrupts. For example, in an exemplary embodiment, the dedicated processor and the DUT communicate using an advanced communication protocol. In response to the output data, the dedicated processor is operable to generate a test outcome signal to the shared processor. The test outcome signal indicates the completion or not completion of the test instruction. In a further embodiment, the shared processor is operable to generate additional test data representing an additional test sequence of signals for one or more additional DUTs prior to or upon receiving the test outcome signal.

In another embodiment, the storage device is further operable to store the test data for executing multiple test instructions on the DUT, and the dedicated processor is operable to select the test data associated with a current one of the test instructions. In yet another embodiment, the storage device is further operable to store the test data for multiple devices under test, and multiple dedicated processors are used for accessing the storage device and transferring the test data from the storage device to respective ones of the multiple devices under test. In still another embodiment, multiple storage devices and multiple dedicated processors are used. Each of the storage devices is operable to store test data for a respective DUT, and each of the dedicated processors is operable to transfer the test data from a respective one of the multiple storage devices to the respective DUT.

Embodiments of the present invention further provide a method for testing DUTs. The method includes generating test data representing a test sequence of signals for performing tests on DUTs, storing the test data and generating a test control signal including one or more test instructions for executing the tests. The method further includes, for each of the DUTs, receiving the test control signal at a dedicated testing device in response to the test control signal, transferring the test data for a select one of the test instructions to the select DUT to execute the select test instruction, and verifying the completion of the select test instruction by the select DUT.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF EXEMPLARY EMBODIMENTS

In traditional ATE systems, the test resource (e.g., pattern generator) is responsible for the following general test functions: (1) generating a stimulus for performing a test on a device under test (DUT), and in some cases, processing a response of the DUT to the stimulus; (2) transferring the generated stimulus to the DUT; and (3) either polling the DUT or ATE or responding to an interrupt from the DUT to verify the completion of the test. In accordance with embodiments of the present invention, these three traditional test resource functions are performed by two independent blocks. The stimulus generation function is performed by shared hardware, while both the transfer function and the polling/interrupt function are performed using hardware dedicated to each DUT. The response processing function is performed by the shared hardware, the dedicated hardware or a combination of the shared hardware and dedicated hardware. This arrangement constitutes a pipelined testing architecture.

By moving the transfer function and polling/interrupt function to hardware dedicated to each DUT, the shared hardware is able to generate the stimulus for the next test without waiting for the current test to be completed by all DUTs. This increases the throughput of the test system. In addition, since only minimal processing is performed by the hardware dedicated to each DUT as compared to the processing performed by the shared hardware, the cost increase over the shared hardware represented by the dedicated hardware is small. Therefore, the pipelined testing architecture also increases the throughput of the ATE system at little incremental cost. Furthermore, utilization of the shared hardware is reduced, thereby enabling the shared hardware to perform other types of processing, such as executing more advanced processing algorithms. Moreover, for multiple pin-count DUTs, a dedicated hardware module can be used for each DUT pin, thereby avoiding any pin-count mismatch between the test system and the DUTs.

Figure 1:
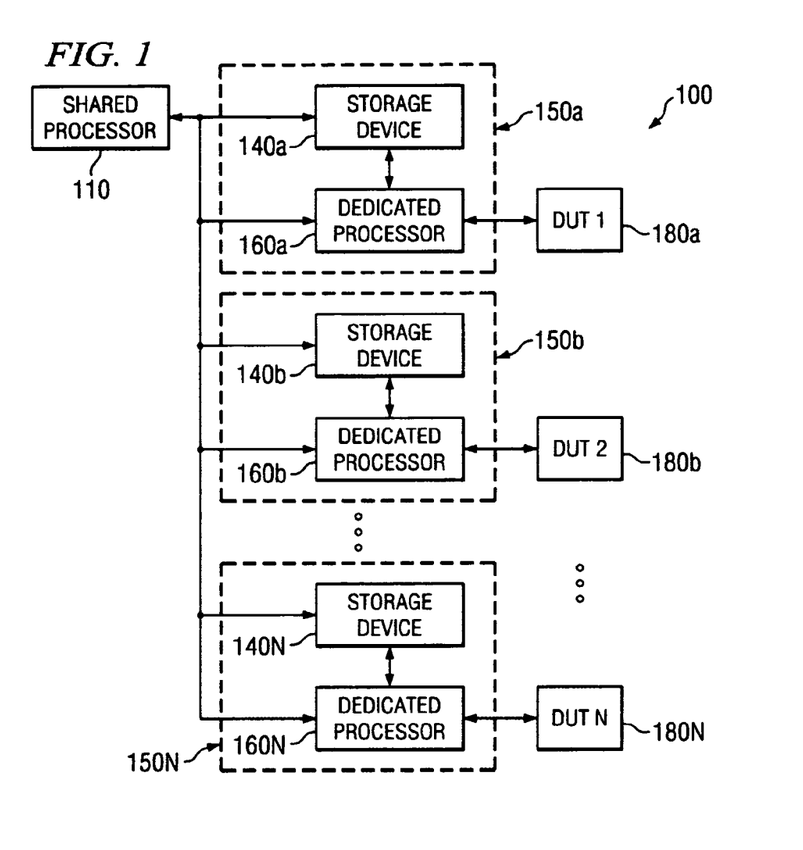
FIG. 1 is a schematic block diagram of an exemplary test system implementing a pipelined testing architecture for testing multiple devices under test in parallel, in accordance with embodiments of the present invention.

FIG. 1 is a schematic block diagram of an exemplary test system 100 implementing an exemplary pipelined testing architecture for simultaneously testing multiple devices under test (DUTs) 180a, 180b . . . 180N in parallel, in accordance with embodiments of the present invention. In one embodiment, the test system 100 is configured to simultaneously perform the same test on all DUTs 180a, 180b . . . 180N. For example, each of the DUTs 180a, 180b . . . 180N can represent a different physical device, a different module of a single physical device or the same module of different physical devices on which the same test is performed simultaneously. In another embodiment, the test system 100 is configured to simultaneously perform different tests on one or more of the DUTs 180a, 180b . . . 180N. For example, each of the DUTs 180a, 180b . . . 180N can represent a different physical device, a different module of a single physical device or a different module of different physical devices on which different tests are performed simultaneously.

The test system 100 includes a shared processor 110 for performing the stimulus generation function and a separate testing device 150a, 150b . . . 150N for each DUT 180a, 180b . . . 180N for performing the transfer and polling/interrupt functions. More specifically, the shared processor 110 performs the stimulus generation function by generating respective test data and test instructions associated with the test data for testing each of the DUTs 180a, 180b . . . 180N and transmitting the test data and test instructions for testing each of the DUTs. 180a, 180b . . . 180N to the respective testing devices 150a, 150b . . . 150N. The test instructions are transmitted from the shared processor 110 to the testing devices 150a, 150b . . . 150N within respective test control signals, as will be described in more detail below. The testing devices 150a, 150b . . . 150N use the received test instructions and associated test data to transfer the test data to their respective DUTs 180a, 180b . . . 180N during performance of one or more tests on their respective DUTs 180a, 180b . . . 180N.

As used herein, "test instructions" are one or more instructions associated with testing a particular DUT 180. In one embodiment, the test instructions constitute a set of operational instructions executable by the testing devices 150a, 150b . . . 150N and/or DUTs 180a, 180b . . . 180N to perform a particular test. For example, in embodiments in which at least one of the DUTs (e.g., DUT 180a) is a memory device, the test instructions include a write instruction that instructs the DUT to write test data to a particular memory address of the DUT 180a and a read instruction that instructs the DUT to read the written data out of the DUT 180a. In another embodiment, the test instructions constitute a subset of the operational instructions to perform a particular test. Using the above example, the write instruction and the read instruction can constitute separate test instructions. Moreover, the shared processor 110 operates so that it transmits the read instruction only after receiving confirmation that the execution of the write instruction is complete.

In yet another embodiment, the test instructions transmitted from the shared processor 110 to the testing devices 150a, 150b . . . 150N are general instructions that instruct the testing devices 150a, 150b . . . 150N to generate the specific operational instructions to perform one or more tests on the respective DUTs 180a, 180b . . . 180N. Continuing with the above example, the shared processor 110 can transmit a general instruction, such as "test memory address A using test data B" to testing device 150a. In response to the general instruction, the testing device 150a generates the above-mentioned operational instructions (i.e., write instruction and read instruction) for the DUT 180a. As another example, the general instruction can be as simple as "begin testing DUT." In response to such a general instruction, the testing device 150a generates the appropriate operational instructions (e.g., write instruction and read instruction) for testing the DUT.

As used herein, the term "test data" includes analog or digital data that is used by the testing device 150a, 150b . . . 150N in performing one or more tests on their respective DUTs 180a, 180b . . . 180N. In one embodiment, the test data is used directly by the testing devices. 150a, 150b . . . 150N as stimuli to test the DUTs 180a, 180b . . . 180N. In an example in which one of the DUTs (e.g., DUT 180a) is a memory device, the shared processor 110 calculates the next address in DUT 180a using a complex algorithm (e.g., a marching pattern), generates the respective digital data for writing into the next address of the DUT 180a and includes the next address and the digital data in the test data provided to the testing device 150a. Based on test instructions additionally provided by the shared processor 110 (e.g., "test DUT using test data") and the received test data, the testing device 150a generates at least one operational instruction, such as a "write" instruction, and incorporates the next address that forms part of the test data into the write instruction. The testing device 150a further provides to the DUT 180a both the write instruction and the digital data included in the test data. In response to the write instruction and associated digital data, the DUT 180a writes the digital data into the next address included in the write instruction.

In another embodiment, the test data includes data that is processed by the testing devices 150a, 150b . . . 150N to generate the stimuli that are used to test the DUTs 180a, 180b . . . 180N. For example, the test data can include the operational instructions that are used by the testing devices 150a, 150b . . . 150N to perform the tests. In such an example, the test instructions provided to the testing devices 150a, 150b . . . 150N include general instructions, such as "test DUT."

In one embodiment, the test data generated by the shared processor 110 is the same for all DUTs 180a, 180b . . . 180N. In another embodiment, the shared processor 110 generates different test data for one or more DUTs 180a, 180b . . . 180N. In an exemplary embodiment, the shared processor 110 sequentially generates the test data for each DUT 180a, 180b . . . 180N and/or for each test of each DUT 180a, 180b . . . 180N. In another exemplary embodiment, the shared processor 110 simultaneously generates respective test data for all of the DUTs 180a, 180b . . . 180N and/or for multiple tests of the DUTs 180a, 180b . . . 180N. For example, the shared processor 110 can be a multi-threaded processor, a multi-core processor, a single-threaded processor with a multi-threaded operating system or multiple single-threaded processors.

Each testing device 150a, 150b . . . 150N includes a respective storage device 140a, 140b . . . 140N that is used in connection with the transfer function and a respective dedicated processor 160a, 160b . . . 160N that performs at least the transfer function and polling/interrupt function. By way of example, but not limitation, each storage device 140a, 140b . . . 140N can include a queue, register, random access memory (RAM), flash memory, cache memory or other type of storage medium. In addition, the shared processor 110 and the dedicated processors 160a, 160b . . . 160N each include one or more microprocessors, microcontrollers, programmable logic devices, digital signal processors or other devices capable of performing the functions described herein. In another embodiment, the storage devices 140a, 140b . . . 140N are included within their respective dedicated processors 160a, 160b . . . 160N.

In operation, the test data generated by the shared processor 110 is received at each storage device 140a, 140b . . . 140N for storage and subsequent input to a respective DUT 180a, 180b . . . 180N. For example, storage device 140a stores test data for testing DUT1 180a, storage device 140b stores test data for testing DUT2 180b and storage device 140N stores test data for testing DUTN 180N. In one embodiment, the shared processor 110 stores the test data directly into the storage devices 140a, 140b . . . 140N. In another embodiment, the shared processor 110 provides the test data to the dedicated processors 160a, 160b . . . 160N, which store the test data in their respective storage devices 140a, 140b . . . 140N.

Each storage device 140a, 140b . . . 140N is capable of simultaneously storing test data associated with multiple tests to be performed on their respective DUT 180a, 180b . . . 180N. For example, in an exemplary operation, during a first clock cycle, the shared processor 110 generates and transmits test data for a first test to each of the storage devices 140a, 140b . . . 140N. During a second clock cycle, the shared processor 110 again generates and transmits test data for a second test to each of the storage devices 140a, 140b . . . 140N. Each of the storage devices 140a, 140b . . . 140N has sufficient capacity to store the test data for both the first test and the second test for subsequent sequential testing of their respective DUTs 180a, 180b . . . 180N by their respective dedicated processors 160a, 160b . . . 160N.

Each dedicated processor 160a, 160b . . . 160N is additionally connected to receive a respective test control signal from the shared processor 110. As described above, the test control signal includes the test instructions that instruct the dedicated processors 160a, 160b . . . 160N to perform one or more tests on their respective DUT 180a, 180b . . . 180N. For example, in one exemplary embodiment, the test control signal sent to a particular dedicated processor (e.g., dedicated processor 160a) includes the set of operational instructions for performing a particular test. As an example, the operational instructions can include a read instruction that instructs the dedicated processor 160a to read the test data out of its respective storage device 140a, a generate stimulus instruction that instructs the dedicated processor 160a to generate test stimuli including the test data read out of the storage device 140a and a write instruction that instructs the dedicated processor 160a to provide the stimuli to the DUT 180a for execution of the write instruction (i.e., writing the test data) to a specified address in the DUT 180a.

In other embodiments, the test control signal also includes control instructions that are used to control the operation of the dedicated processors 160a, 160b . . . 160N during testing. In an exemplary embodiment, the control instructions include instructions that instruct the dedicated processors 160a, 160b . . . 160N to verify completion of a test. By way of example, but not limitation, the control instructions can instruct the dedicated processors 160a, 160b . . . 160N to wait for an interrupt message from the DUTs 180a, 180b . . . 180N or to poll the DUTs 180a, 180b . . . 180N to verify completion of a test. In another exemplary embodiment, the control instructions include instructions that instruct the dedicated processors 160a, 160b . . . 160N to report results to the shared processor 110. The dedicated processors 160a, 160b . . . 160N report the results to the shared processor 110 by providing to the shared processor 110 respective test outcome signals, which will be described in further detail below. By way of example, but not limitation, the control instructions can instruct the dedicated processors 160a, 160b . . . 160N to report whether or not each test instruction and/or operational instruction was completed, to report only those test instructions and/or operational instructions that were not completed, to report the results of each test or to report only failed tests.

In one embodiment, the shared processor 110 broadcasts a single test control signal to all dedicated processors 160a, 160b . . . 160N to initiate one or more DUT tests. In an exemplary embodiment, the broadcast test control signal includes test instructions that instruct all of the dedicated processors 160a, 160b . . . 160N to access their respective storage device 140a, 140b . . . 140N and transfer the next test data or an identified portion of the test data stored in their respective storage device 140a, 140b . . . 140N to a specified address, identified by the test control signal or defined by the test data, in their respective DUT 180a, 180b . . . 180N.

In another embodiment, the shared processor 110 is operable to transmit individual test control signals, one for each dedicated processor 160a, 160b . . . 160N, to initiate execution of one or more DUT tests. In an exemplary embodiment, the test control signal for each dedicated processor 160a, 160b . . . 160N includes a respective identifier of particular test data stored in each storage device 140a, 140b . . . 140N, and the dedicated processors 160a, 160b . . . 160N operate in response to the respective identifiers to transfer the respective identified test data from their respective storage device 140a, 140b . . . 140N to their respective DUT 180a, 180b . . . 180N. In another exemplary embodiment, the test control signal for each dedicated processor 160a, 160b . . . 160N includes a respective address in each DUT 180a, 180b . . . 180N to where each dedicated processor 160a, 160b . . . 160N is to transfer test data read from the respective storage device 140a, 140b . . . 140N. The test data is either the next test data in their respective storage device 140a, 140b . . . 140N or an identified portion of the test data stored in their respective storage device 140a, 140b . . . 140N.

In addition, the dedicated processors 160a, 160b . . . 160N are further operable to verify the completion of one or more test instructions (e.g., operational instructions and/or general instructions) associated with a particular test. To verify the completion of a test instruction, each dedicated processor 160a, 160b . . . 160N is connected to receive a response from its respective DUT 180a, 180b . . . 180N. In one embodiment, the response is an interrupt message indicating that the DUT 180a, 180b . . . 180N has completed the current test. In another embodiment, the response is a response to a polling message generated by the dedicated processor 160a, 160b . . . 160N for the DUT 180a, 180b . . . 180N. For example, in the polling mode, each dedicated processor 160a, 160b . . . 160N sends a query to its respective DUT 180a, 180b . . . 180N asking whether the execution of the test instruction is complete, and the DUT 180a, 180b . . . 180N provides a "complete" or "not complete" response to its respective dedicated processor 160a, 160b . . . 160N.

In other embodiments, each dedicated processor 160a, 160b . . . 160N is further operable to determine the result of a current test performed on its respective DUT 180a, 180b . . . 180N. In an example, DUT 180a is a memory device and the test control signal received by the dedicated processor 160a can include instructions for performing a current test of a particular memory address in the DUT 180a. For example, the test control signal can include a memory address, a write instruction that instructs the dedicated processor 160a to perform an operation in which it causes the test data stored in its respective storage device 140a to be written at a specified memory address of DUT 180a, a read instruction that instructs the DUT 180a to read the data at the memory address of DUT 180a and a comparison instruction that instructs the dedicated processor 160a to compare the read data to the original test data. Thus, after causing the DUT to write the test data to the memory address in the DUT 180a and verifying completion of the write instruction (e.g., by polling or interrupt), the dedicated processor 160a instructs the DUT 180a to read the written data out of the memory address in the DUT 180a and compares the read-out data to the original test data. If the comparison indicates that the data read out of the DUT 180a is the same as the original test data, the dedicated processor 160a determines that the test was successful. However, if the comparison indicates that the data read out of the DUT 180a differs from the original test data, the dedicated processor 160 determines that the test failed.

The test control signals not only control the execution of test instructions by the dedicated processors 160a, 160b . . . 160N and/or DUTs 180a, 180b . . . 180N, but also control the timing during execution of one or more test instructions. For example, in one embodiment, the shared processor 110 generates an initial test control signal that includes a general instruction that instructs the testing devices 150a, 150b . . . 150N to initiate one or more DUT tests. In response to the initial test control signal, each dedicated processor 160a, 160b . . . 160N accesses its respective storage device 140a, 140b . . . 140N to retrieve and/or generate the operational instructions for performing the DUT tests and sequentially transfers the test data stored in its storage device 140a, 140b . . . 140N to its respective DUT 180a, 180b . . . 180N in accordance with the operational instructions. This process continues until either the shared processor 110 generates a test control signal including a general instruction instructing the testing devices 150a, 150b . . . 150N to terminate DUT testing or all of the dedicated processors 160a, 160b . . . 160N determine there are no more operational instructions associated with the DUT tests.

In another embodiment, the shared processor 110 generates a new test control signal for each operational instruction. In one embodiment, once all dedicated processors 160a, 160b . . . 160N verify the completion of a current operational instruction by their respective DUTs 180a, 180b . . . 180N and provide verification of completion of the execution of the current operational instruction in respective test outcome signals transmitted to the shared processor 110, the shared processor 110 generates and transmits a new test control signal including a new operational instruction (e.g., broadcasts the same test control signal or transmits individually-tailored test control signals) to all of the dedicated processors 160a, 160b . . . 160N.

In another embodiment, the shared processor 110 generates and transmits respective test control signals to each dedicated processor 160a, 160b . . . 160N to control the timing of each DUT test performed by the dedicated processor 160a, 160b . . . 160N. For example, if the shared processor 110 receives a test outcome signal from only dedicated processor 160a, the shared processor 110 generates and transmits a new test control signal only to dedicated processor 160a.

In a further embodiment, the shared processor 110 generates a new test control signal for each operational instruction that should be repeated. For example, if dedicated processor 160a receives a "not complete" response from DUT 180a after a "time out" occurs indicating that the execution of the current operational instruction was not completed, the dedicated processor 160a can report the incomplete operational instruction to the shared processor 110 and wait for another test control signal before repeating the same operational instruction.

As described above, the dedicated processors 160a, 160b . . . 160N are further operable to generate respective test outcome signals and to transmit such test outcome signals to the shared processor 110. Each test outcome signal is indicative of at least the completion of execution of one or more operational instructions. For example, in one embodiment, each dedicated processor 160*a*, 160*b* . . . 160N generates a respective separate test outcome signal at the completion of the execution of each operational instruction. In another embodiment, each dedicated processor 160*a*, 160*b* . . . 160N generates a respective test outcome signal at the completion of execution of all operational instructions associated with a particular DUT test (i.e., the completion of each test). In yet another embodiment, each dedicated processor 160*a*, 160*b* . . . 160N generates a respective test outcome signal at the completion of execution of all test instructions in a particular test control signal.

In other embodiments, the test outcome signal also includes additional information related to the execution of the test instruction(s). In an example, the test outcome signal generated by dedicated processor 160*a* includes the content of an interrupt message sent by its DUT 180*a*. In another example, in response to a "not complete" response for a particular operational instruction in the polling mode, in one embodiment, dedicated processor 160*a* increments a counter for each "not complete" response received for the particular operational instruction, and provides the value of the counter upon receiving a "complete" response from the DUT 180*a* in the test outcome signal transmitted to the shared processor 110. In a further example, the dedicated processor 160*a* compares the current value of the counter to a maximum value provided in the test control signal, and if the current counter value exceeds the maximum value before the dedicated processor 160*a* receives a "complete" response from the DUT 180*a*, the dedicated processor 160*a* indicates that the execution of the operational instruction was not completed in the test outcome signal transmitted to the shared processor 110. In yet another example, the dedicated processor 160*a* is provided with a counter set at a maximum number of "not complete" responses in the test control signal, and the dedicated processor 160*a* decrements the counter each time it receives a "not complete" response from DUT 180*a*. If the counter value returns to zero before the dedicated processor 160*a* receives a "complete" response, the dedicated processor 160*a* indicates that the execution of the operational instruction was not completed in the test outcome signal transmitted to the shared processor 110.

In yet another embodiment, the test outcome signal generated by each dedicated processor 160*a*, 160*b* . . . 160N further includes the results of one or more tests. In an example, in embodiments in which DUT 180*a* is a memory device, the test outcome signal generated by dedicated processor 160*a* includes failure data indicating which memory addresses failed to store the test data.

Figure 2:
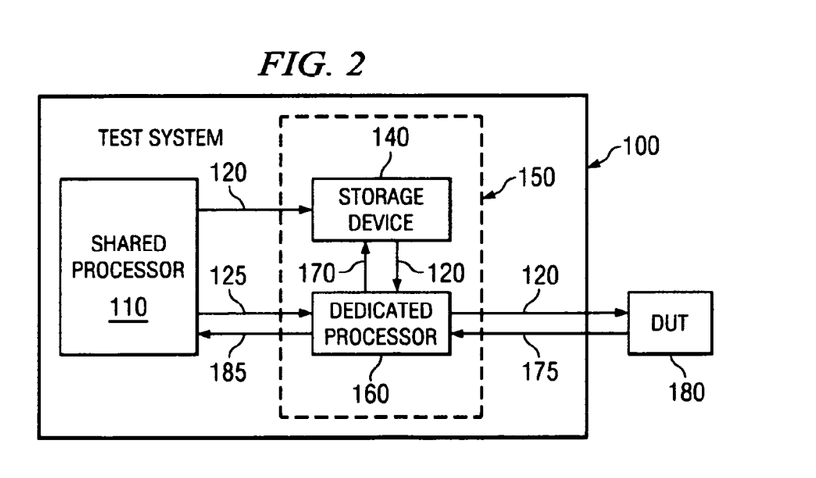
FIG. 2 is a block diagram that illustrates a more detailed view of one channel of the test system for testing a single DUT, in accordance with embodiments of the invention.

Turning now to FIG. 2, there is illustrated a more detailed view of one channel of the test system 100 for testing a respective DUT 180 in accordance with embodiments of the present invention. As described above in connection with FIG. 1, the shared processor 110 is operable to generate test data 120 for testing DUT 180 and to store the generated test data 120 in the storage device 140 of the testing device 150 dedicated to testing the DUT 180. The shared processor 110 is further operable to generate a test control signal 120 for transmission to the dedicated processor 160 of the testing device 150. The test control signal 125 includes test instructions that instruct the testing device 150 to perform one or more tests of the DUT 180.

In one embodiment, the test control signal 125 includes a single test instruction (i.e., a general instruction that instructs the dedicated processor 160 to perform a particular test or a single operational instruction of a particular test), while in other embodiments, the test control signal includes multiple test instructions (i.e., multiple general instructions that instruct the dedicated processor 160 to perform multiple tests or multiple operational instructions of a single test). In the latter embodiment, the shared processor 110 stores in the storage device 140 the test data 120 needed by the dedicated processor 160 to execute each test instruction in the test control signal 125. In another embodiment, the shared processor 110 provides an initial test instruction in the test control signal 125 and stores other test instructions in the storage device 140, along with the test data 120 for the other test instructions. In response to the test control signal 125, the dedicated processor 160 provides an access control signal 170 to the storage device 140 to retrieve the test data 120 associated with the test instructions within test control signal 125. The dedicated processor 160 executes at least one of the test instructions using the retrieved test data 120. In an example in which the DUT is a memory device, the dedicated processor 160 instructs the DUT 180 to write the retrieved test data 120 to a memory address in the DUT 180. In addition, the dedicated processor 160 is further operable to verify the completion of the execution of the test instructions by the DUT. Using the above example, the dedicated processor 160 waits for an interrupt message from the DUT or polls the DUT to verify the completion of the writing operation.

For example, in some embodiments in which the storage device 140 is structured as a queue, the test control signal 125 instructs the dedicated processor 160 to access the storage device 140 and provide the next test data 120 in the storage device 140 to the DUT 180. Thus, the access control signal 170 causes the storage device 140 to output the next test data 120 in the storage device 140 to the dedicated processor 160 for the dedicated processor 160 to input to the DUT 180.

The size of the queue is dependent upon the program time of the DUT 180. As used herein, the term "program time" refers to the number of clock cycles required for the dedicated processor 160 to verify the execution of a particular operational instruction. For example, in embodiments in which the DUT 180 is a memory device and the operational instruction is a write instruction, the program time is the number of clock cycles required for the dedicated processor 160 to transfer the test data 120 from the storage device 140 to the DUT 180, command the DUT 180 to write the test data and verify the completion of the execution of the write instruction by the DUT using the transferred test data 120.

The minimum size of the queue is equal to the maximum program time for a DUT 180 divided by the minimum program time for a DUT 180. In addition, the minimum size of the queue is dependent upon the utilization of the shared processor 110. For example, in one embodiment, the shared processor 110 is operable to generate new test data 120 for the same DUT 180 or another DUT 180 and to provide the new test data 120 to the storage device 140 while the dedicated processor 160 is verifying the completion of the current test instruction by the DUT 180. Thus, in this embodiment, the queue size should be sufficient to hold the test data 120 for at least two test instructions (general or operational).

To verify the completion of a test instruction (general or operational), the dedicated processor 160 is connected to receive a response 175 from the DUT 180. The response 175 includes at least the data necessary for the dedicated processor 160 to verify the completion of the test instruction by the DUT 180. In one embodiment, the response 175 is sent from the DUT 180 to the dedicated processor 160 as an interrupt message. In another embodiment, the response 175 is sent from the DUT 180 to the dedicated processor 160 in response to a polling message generated by the dedicated processor 160 for the DUT 180. In a further embodiment, the response 175 further includes data that enables the dedicated processor 160 to determine the result (e.g., success or failure) of a particular test.

In one embodiment, the dedicated processor 160 and DUT 180 communicate using a simple communication protocol. In other embodiments, the dedicated processor 160 and the DUT 180 communicate using an advanced communication protocol (e.g., Internet Protocol or Ethernet) that reduces the latency of communication and facilitates higher level communication between the dedicated processor 160 and the DUT 180. As used herein, the term "advanced communication protocol" refers to one in which state machines in the dedicated processor 160 and DUT 180 require synchronization. However, the communication interface between the dedicated processor 160 and DUT 180 may be synchronous or asynchronous. As is understood in the art, a common synchronization procedure involves sending messages between state machines. Thus, polling messages sent from the dedicated processor 160 to the DUT 180 and interrupt messages sent from the DUT 180 to the dedicated processor 160 each facilitate synchronization between the DUT 180 and dedicated processor 160. However, embodiments of the present invention are not limited to polling and/or interrupt messages, but rather include any message sent using the advanced communication protocol.

As described above, the dedicated processor 160 also generates a test outcome signal 185 based on the response 175 and transmits the test outcome signal 185 to the shared processor 110. The shared processor 110 determines the next action to be taken by the shared processor 110 with respect to DUT 180 in response to the test outcome signal 185. In one embodiment, in response to the test outcome signal 185, the shared processor 110 generates the next set of test instructions and associated test data 120 and sends these to the testing device 150. In other embodiments, the shared processor 110 generates additional test data 120 and one or more additional test instructions while the dedicated processor 160 is executing one or more current test instructions, and upon receiving the test outcome signal 185, the shared processor 110 outputs the additional test data 120 and associated test instructions to the testing device 150, where they are stored in the storage device 140.

In another embodiment, since the data transfer and polling/interrupt functions are performed by the dedicated processor 160, the shared processor 110 is also able to execute more advanced processing algorithms to generate the test data and test instructions without requiring an external work station. For example, in one embodiment, the shared processor 110 determines whether the DUT 180 is defective from the test outcome signal 185. In another embodiment, the shared processor 110 determines from the test outcome signal 185 whether to instruct the dedicated processor 160 to repeat the DUT test instruction(s). In yet another embodiment, in response to the test outcome signal 185, the shared processor 110 generates repair data for repairing a defective DUT 180 and provides the repair data to the dedicated processor 160 for use by the dedicated processor 160 in repairing the defective DUT 180. In still another embodiment in which the test outcome signal 185 includes a DUT interrupt message, the shared processor 110 generates a response to the DUT interrupt message and provides the response to the dedicated processor 160 that the dedicated processor 160 communicates to the DUT 180.

Figure 3:
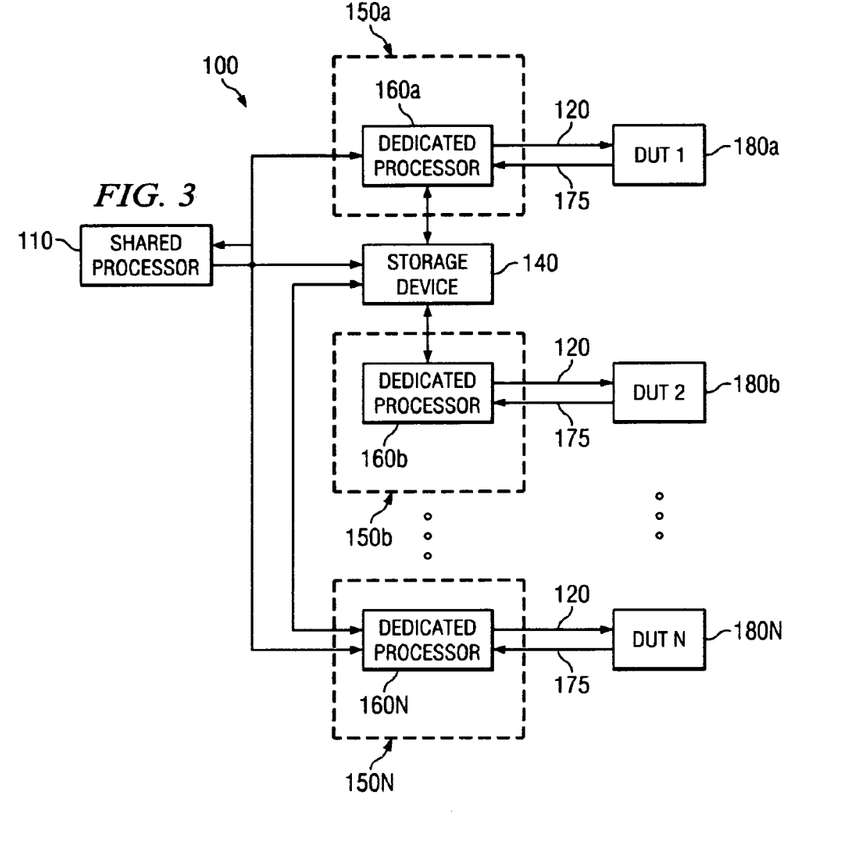
FIG. 3 is a schematic diagram that illustrates another configuration of the test system for testing multiple devices under test in parallel, in accordance with embodiments of the invention.

FIG. 3 is a schematic diagram that illustrates another configuration of the test system for testing multiple DUTs 180 in parallel in accordance with embodiments of the invention. In FIG. 3, the shared processor 110 is again connected to multiple testing devices 150a, 150b . . . 150N to test multiple DUTs 180a, 180b . . . 180N in parallel. However, instead of providing a respective storage device 140 for each testing device 150a, . . . 150N, the test system 100 includes a centralized storage device 140 for collecting and storing all test data for all testing devices 150a, 150b . . . 150N. The storage device 140 is capable of simultaneously storing test data generated by the shared processor 110 for one or more test instructions (general or operational) for one or more DUTs 180a, 180b . . . 180N.

Each dedicated processor 160a, 160b . . . 160N accesses the centralized storage device 140 to transfer test data stored in the centralized storage device 140 from the centralized storage device 140 to a respective DUT 180a, 180b . . . 180N. For example, in one embodiment, the test data generated by the shared processor 110 and stored in the centralized storage device 140 includes both a common address for all DUTs 180a, 180b . . . 180N and test data to be transferred into that address of each DUT 180a, 180b . . . 180N. Thus, upon receiving a broadcast or individually transmitted test control signal from the shared processor 110, each dedicated processor 160a, 160b . . . 160N accesses the centralized storage device 140 to transfer the test data to their respective DUT 180a, 180b . . . 180N. In one exemplary embodiment, each dedicated processor 160a, 160b . . . 160N copies the test data from the centralized storage device 140 and transfers the copied test data to its respective DUT 180a, 180b . . . 180N. In another exemplary embodiment, the stored test data stored in the storage device 140 includes only the common test data, and the addresses (unique or common) are provided to the dedicated processors 160a, 160b . . . 160N in the individual test control signals generated by the shared processor 110.

In another embodiment, the shared processor 110 generates a unique test data set for one or more of the DUTs 180a, 180b . . . 180N. Each unique test data set includes either unique test data (and a unique or common address) for transfer to a particular DUT 180a, 180b . . . 180N or common test data (and a unique or common address) for transfer to a particular DUT 180a, 180b . . . 180N. The shared processor 110 generates each unique test data set for each DUT 180a, 180b . . . 180N and stores the unique test data sets in the storage device 140. In one exemplary embodiment, each testing device 150a, 150b . . . 150N is assigned a unique identifier, and the test data for a particular DUT is stored with the associated testing device identifier in the centralized storage device 140. When a dedicated processor 160a accesses the centralized storage device 140, the dedicated processor 160a uses the unique identifier of its testing device 150a to identify and retrieve the test data for the DUT 180a. In another exemplary embodiment, the test data for each DUT is assigned a unique test data identifier that is stored with the test data in the storage device 140. The test data identifiers are provided to the dedicated processors 160a, 160b . . . 160N in the individual test control signals generated by the shared processor 110.

Figure 4:
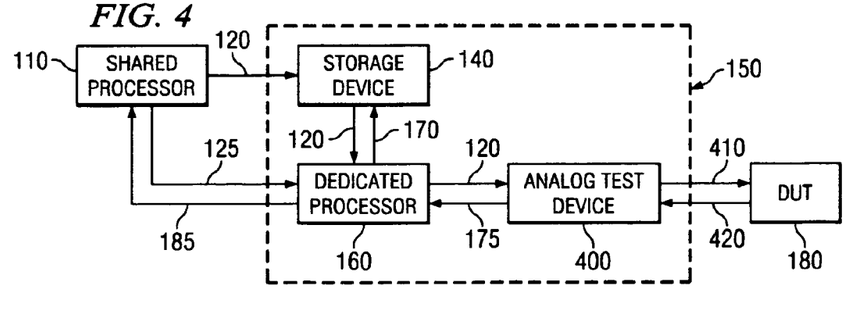
FIG. 4 is a block diagram that illustrates yet another configuration of the test system for testing an analog device under test, in accordance with embodiments of the invention.

FIG. 4 is a block diagram that illustrates yet another configuration of the test system for testing an analog device under test (DUT) 180, in accordance with embodiments of the invention. In FIG. 4, the testing device 150 for testing the analog DUT 180 includes the storage device 140, the dedicated processor 160 and an analog test device 400. The analog test device includes one or more digital-to-analog converters and one or more analog-to-digital converters for facilitating communication between the analog DUT 180 and the dedicated processor 160.

As described above in connection with FIG. 2, the shared processor 110 is operable to generate test data 120 for testing a DUT 180 and to store the generated test data 120 in the storage device 140 of the testing device 150 dedicated to testing the DUT 180. The shared processor 110 is further operable to generate a test control signal 125 to the dedicated processor 160 of the testing device 150. The test control signal 125 includes test instructions (general or operational) for executing one or more tests of the DUT 180. In response to the test control signal 125, the dedicated processor 160 is operable to provide an access control signal 170 to the storage device 140 to transfer the test data 120 to the DUT 180 to execute one of the test instructions. However, as shown in FIG. 4, for an analog DUT 180, instead of directly providing the test data 120 to the DUT 180, the dedicated processor 160 first transfers the test data 120 to the analog test device 400 for conversion of the test data 120 into an analog stimulus 410. The analog test device 400 transfers the analog stimulus 410 to the analog DUT 180 for testing of the analog DUT 180.

In addition, as described above in connection with FIG. 2, the dedicated processor 160 is further operable to verify the completion of the test instructions. However, as shown in FIG. 4, to verify the completion of a test instruction, the analog test device 400 is connected to receive an analog response 420 from the analog DUT 180 and to convert the analog response 420 to a digital response 175 for transmission to the dedicated processor 160. The response 175 includes at least the data necessary for the dedicated processor 160 to verify the completion of the test instruction by the DUT 180. In a further embodiment, the response 175 further includes data that enables the dedicated processor 160 to determine the result (e.g., success or failure) of a particular test.

The dedicated processor 160 is further operable to generate a test outcome signal 185 based on the response 175 and transmit the test outcome signal 185 to the shared processor 110. The test outcome signal 185 is indicative of at least the completion of one or more test instructions. Thus, in one embodiment, the test outcome signal 185 is generated separately for each DUT test instruction regardless of the number of test instructions included in the test control signal 125 or stored in the storage device 140. In another embodiment, the test outcome signal 185 is generated at the completion of all test instructions in the test control signal 125 or stored within the storage device 140. In other embodiments, the test outcome signal 185 also includes additional information related to the execution of the test instruction(s) and/or related to the success or failure of one or more tests.

Figure 5:
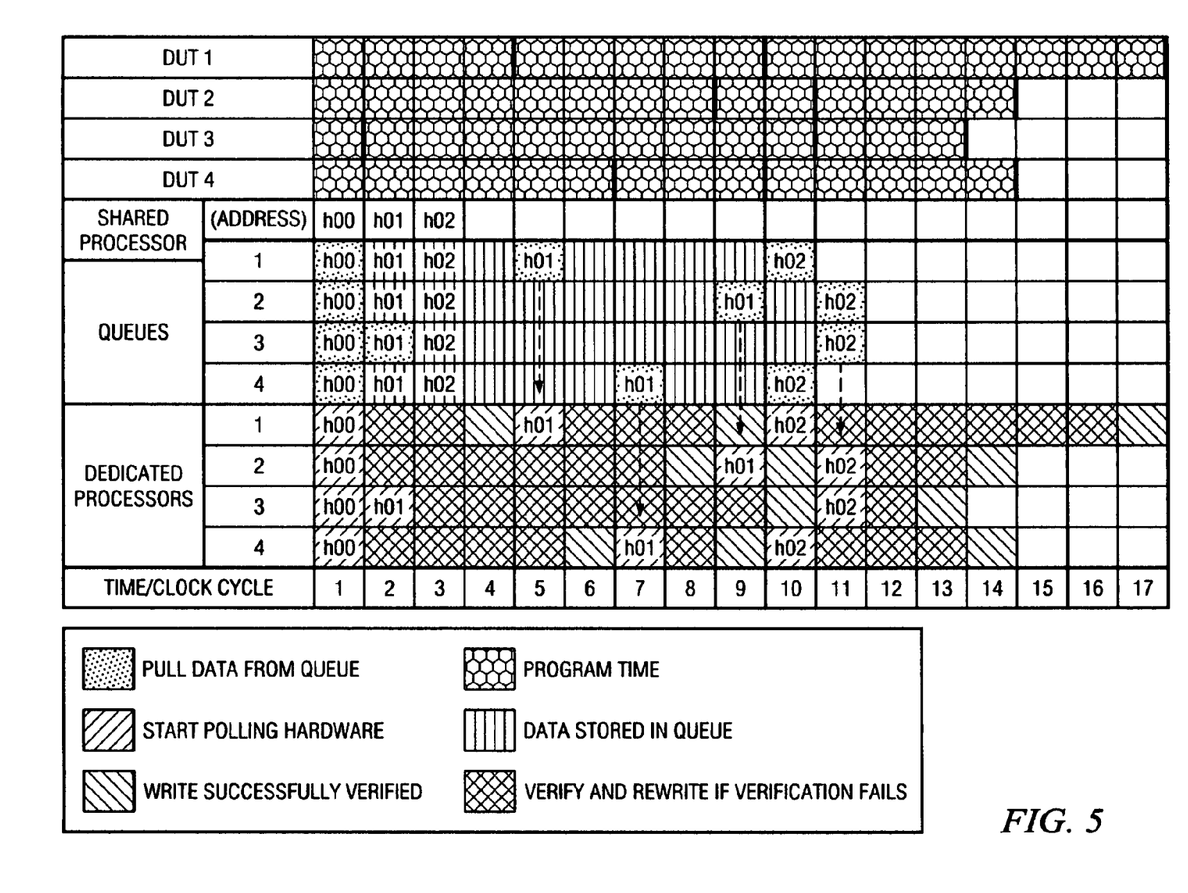
FIG. 5 is a timing diagram illustrating an exemplary execution of the test system of the present invention.

FIG. 5 is a timing diagram illustrating an exemplary execution of the test system of the present invention. FIG. 5 illustrates the time or number of clock cycles required to perform a DUT test on four DUTs, DUT1, DUT2, DUT3 and DUT4 by a single shared processor. By using one shared processor for multiple DUTs, the cost of the DUT testing operation is minimized. The DUT test shown in FIG. 5 involves the transfer of test data for three test instructions, represented by addresses h00, h01 and h02, and verification of the completion of the three test instructions. Each DUT has a respective memory, referred to in FIG. 5 as a queue, and a respective dedicated processor constituting a part of a respective testing device associated therewith. For example, DUT1 is associated with queue 1 and dedicated processor 1, DUT 2 is associated with queue 2 and dedicated processor 2, DUT 3 is associated with queue 3 and dedicated processor 3 and DUT4 is associated with queue 4 and dedicated processor 4.

As described above, the number of clock cycles required to transfer test data to a DUT for a particular test instruction and to verify the completion of that test instruction is commonly referred to as the program time. The program time for each test for each DUT is represented by the honeycombed blocks next to each DUT. Thick, solid black lines separate the program time for each test in each DUT. For example, for DUT1, the program time for transferring test data for the first test instruction (h00) and verifying the completion of the first test instruction (h00) is four clock cycles, the program time for the second test instruction (h01) is five clock cycles and the program time for the third test instruction (h02) is eight clock cycles.

The specific events occurring during each clock cycle can be seen in more detail when viewing the shared processor section, queues section and dedicated processors section. As can be seen from the shared processor section, queues section and dedicated processors section, during clock cycle one, the shared processor generates the test data for the first test instruction (h00) and stores the test data in queues 1, 2, 3 and 4, and the dedicated processors 1, 2, 3 and 4 each pull the test data for the first test instruction (h00) from respective queues 1, 2, 3 and 4 and transfer the test data for the first test instruction (h00) to respective DUTs 1, 2, 3 and 4. In addition, during clock cycle one, dedicated processor 3 verifies the completion of test instruction h00 by DUT3.

During clock cycle two, the shared processor generates the test data for the second test instruction (h01) and stores the test data in queues 1, 2, 3 and 4, and dedicated processor 3 pulls the test data for the second test instruction (h01) from queue 3 and transfers the test data for the second test instruction (h01) to DUT3. In addition, during clock cycle two, dedicated processors 1, 2 and 4 poll DUTs 1, 2 and 4, respectively, to verify the completion of the first test instruction (h00), and re-write the test data for the first test instruction (h00) to the respective DUTs 1, 2 and 4 if the verification fails.

During clock cycle three, the shared processor generates the test data for the third test instruction (h02) and stores the test data in queues 1, 2, 3 and 4. Thus, after three clock cycles, the shared processor is available to generate new test data for the same or different DUTs, thereby avoiding under-utilization of the shared processor and maximizing throughput performance of the test system. In addition, during clock cycle three, dedicated processors 1, 2 and 4 again poll DUTs 1, 2 and 4, respectively, to verify the completion of the first test instruction (h00), and re-write the test data for the first test instruction (h01) to the respective DUTs 1, 2 and 4 if the verification fails. Furthermore, dedicated processor 3 polls DUT3 to verify the completion of the second test instruction (h01), and re-writes the test data for the second test instruction (h01) to DUT3 if the verification fails.

During clock cycle four, dedicated processor 1 verifies the successful completion of the first test instruction (h00) to DUT1, while dedicated processors 2, 3 and 4 continue to poll their respective DUTs 2, 3 and 4. During clock cycle five, dedicated processor 1 pulls the test data for the second test instruction (h01) from queue 1 and transfers the test data for the second test instruction (h01) to DUT1. Each dedicated processor continues to verify the successful completion of each test instruction to its respective DUT until completion of all test instructions has been verified. As can be seen, the DUT test takes a total of seventeen clock cycles, corresponding to the maximum individual test time. However, it can also be seen that each DUT individually completes its test instruction at a different time, thereby avoiding under-utilization of test pins and DUTs.

The following table illustrates the effectiveness of the pipelined testing architecture exemplified in FIG. 5 compared to the effectiveness of a known shared architecture, a known per site architecture and a known per site architecture with multiple DUT's per site.

|   |   | Test Time | | Processor Utilization Clock Cycles | | Test System Area Overhead | |
|---|---|---|---|---|---|---|---|
|   |   | Number of clock cycles | % of clock cycles | Number of clock cycles | % of clock cycles | Number of Processors | % of Area Overhead |
| 1 | Shared Architecture | 25 | 100% | 25 | 100% | 1 | 100% |
| 2 | Per site Architecture | 17 | 72% | 17 | 72% | 4 | 400% |
| 3 | Per site Architecture with multiple DUTs/site | 21 | 84% | 21 | 84% | 2 | 200% |
| 4 | Pipelined Testing Architecture | 17 | 72% | 3 | 12% | 1 | 116% |

As is evident from the above table, the pipelined testing architecture requires the fewest test time clock cycles at 17 and the fewest shared processor clock cycles at 3, while maintaining a low area overhead of 116% for the test system. The area overhead was calculated using 100% for each shared processor and only 2% for each queue and 2% for each dedicated processor based on the cost differential between the shared processor and the queues and dedicated processors. Thus, the pipelined testing architecture of FIG. 5 produces an 86% reduction in shared processor utilization and a 32% increase in throughput from that of a shared architecture. In addition, the pipelined testing architecture is less expensive than the per site architecture or the per site architecture supporting multiple DUTs per site.

Figure 6:
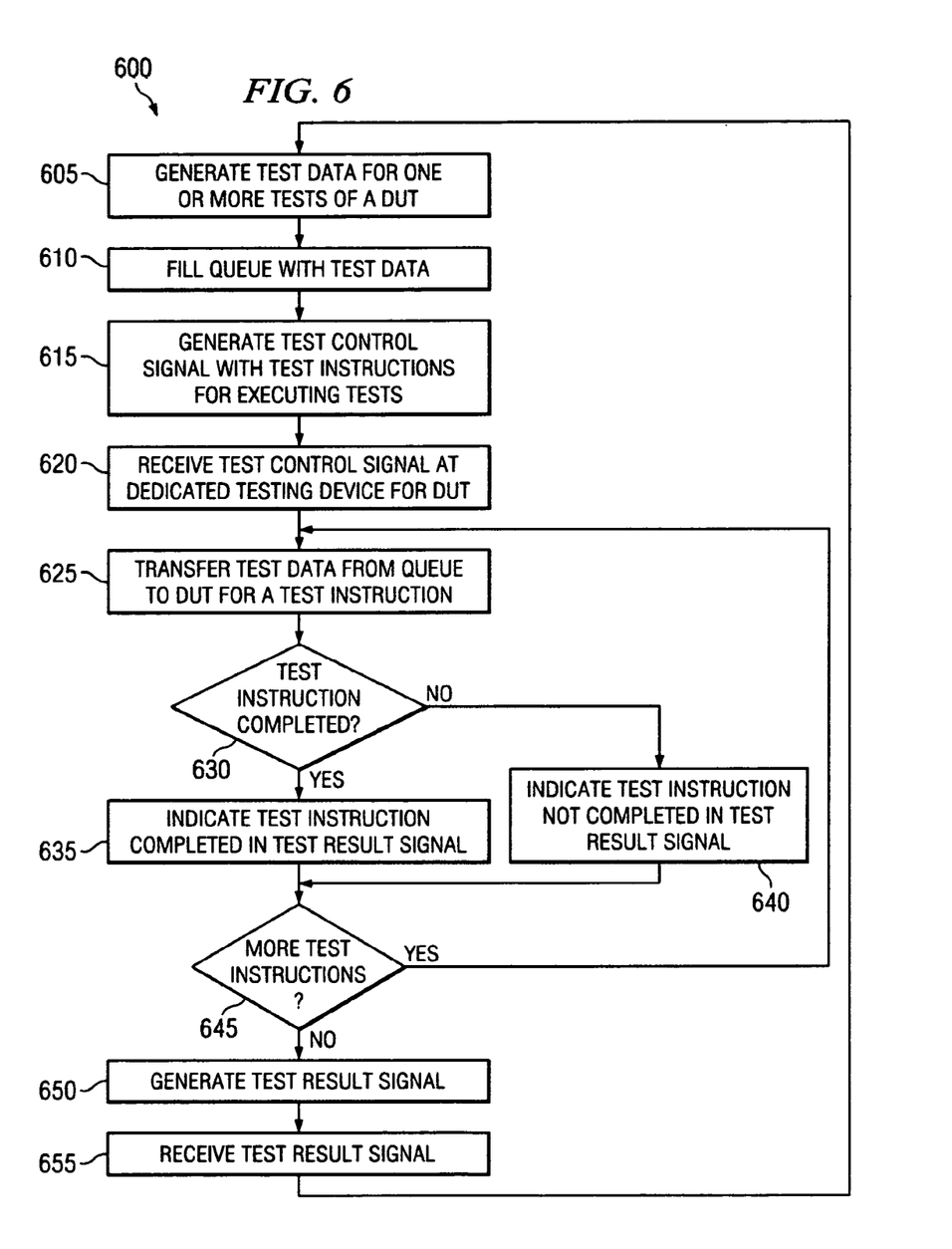
FIG. 6 is a flow chart that illustrates an exemplary process for testing devices under test, in accordance with embodiments of the present invention.

FIG. 6 is a flow chart that illustrates an exemplary process 600 for testing devices under test (DUTs) in accordance with embodiments of the present invention. Initially, at block 605, test data for performing one or more tests on DUTs is generated. At block 610, the test data is stored, and at block 615, a test control signal is generated. The test control signal includes test instructions for executing the tests.

Thereafter, at block 620, the test control signal is received at a dedicated testing device for a particular DUT. In response to the test control signal, at block 625, the test data associated with a current one of the test instructions is transferred to the DUT. At block 630, a determination is made whether the current test instruction is completed. In one embodiment, the completion of the current test instruction is verified by polling the DUT. In another embodiment, the completion of the current test instruction is verified based on a DUT interrupt. If the test instruction is completed, at block 635, an indication that the test instruction was completed is provided. If not, at block 640, an indication that the test instruction was not completed is provided.

Thereafter, at block 645, a determination is made whether test data exists for additional test instructions. If so, at block 625, the test data for a next one of the test instructions is transferred to the DUT. If not, at block 650, a test outcome signal indicating whether each of the test instructions was completed is generated. In another embodiment, a separate test outcome signal is generated and sent for each test instruction. Upon receipt of the test outcome signal at block 655, additional test data for additional test instructions is generated at block 605.

The innovative concepts described in the present application can be modified and varied over a wide rage of applications. Accordingly, the scope of patented subject matter should not be limited to any of the specific exemplary teachings discussed, but is instead defined by the following claims.

We claim:

1. A test system, comprising:
a shared processor operable to generate test data for performing tests on devices under test and to generate a respective test control signal for each of said devices under test, said test data including stimuli for the devices under test, and each said test control signal including test instructions for performing said tests;
a storage device operable to store said test data associated with at least one of said devices under test, wherein the storage device is capable of simultaneously storing test data associated with multiple ones of said test instructions; and
for each of said devices under test, a dedicated processor operable to receive said respective test control signal from said shared processor, and in response to said respective test control signal, transfer said test data associated with a respective one of said test instructions from said storage device to said one of said devices under test in accordance with said respective test instructions, said dedicated processor being further operable to i) receive output data from the one of the devices under test to verify the completion of said respective test instructions, and to ii) generate a test outcome signal to the shared processor in response to said output data, said test outcome signal indicating completion of the respective one of the test instructions;
wherein the shared processor is operable to i) generate and store in the storage device test data for a first test instruction during a first clock cycle, and ii) generate and store in the storage device test data for a second test instruction during a second clock cycle, prior to receiving the test outcome signal indicating completion of the first test instruction from the dedicated processor for at least one of the devices under test.

2. The test system of claim 1, wherein each said dedicated processor is further operable to poll said one of said devices under test for said response to verify the completion of said test instructions.

3. The test system of claim 1, wherein said response includes an interrupt message.

4. The test system of claim 1, wherein said dedicated processor is further operable to generate a test outcome signal based on said response and to transmit said test outcome signal to said shared processor, wherein said test outcome signal indicates completion or non-completion of one or more of said test instructions.

5. The test system of claim 4, wherein said test outcome signal further indicates results of one or more of said tests.

6. The test system of claim 5, wherein said shared processor is operable to generate repair data for repairing a select one of said devices under test upon receiving said test outcome signal associated with said select one of said devices under test.

7. The test system of claim 4, wherein said shared processor is operable to generate additional test data for performing additional tests on said devices under test prior to receiving said test outcome signal from said dedicated processor.

8. The test system of claim 4, wherein, upon receiving said test outcome signal associated with a select one of said devices under test, said shared processor is operable to store additional test data for performing additional tests on said select one of said devices under test in said storage device.

9. The test system of claim 8, wherein said shared processor is further operable to generate said additional test data prior to receiving said test outcome signal.

10. The test system of claim 1, wherein said shared processor is further operable to broadcast said test control signal to said dedicated processors.

11. The test system of claim 1, wherein said storage device is further operable to store said test data for each of said devices under test.

12. The test system of claim 1, wherein said storage device includes a respective storage device for each of said devices under test.

13. A method for testing devices under test, comprising:
generating, by a shared processor, test data for performing tests on devices under test, said test data including stimuli for the devices under test;
storing said test data;
generating, by said shared processor, a respective test control signal for each of said devices under test, each said test control signal including test instructions for performing said tests;
for each one of said devices under test:
receiving said respective test control signal at a respective dedicated testing device;
in response to receipt of said test control signal at said dedicated testing device, transferring said respective test data to said respective one of said devices under test in accordance with said respective test instructions; and
by said dedicated testing device, verifying the completion of said respective test instructions and generating a test outcome signal indicating the completion of a test instruction to the shared processor; and
said shared processor i) generating and storing in the storage device test data for a first test instruction during a first clock cycle, and ii) generating and storing in the storage device test data for a second test instruction during a second clock cycle, prior to receiving the test outcome signal indicating completion of the first test instruction from the dedicated processor for at least one of the devices under test.

14. The method of claim 13, wherein said verifying comprises:
polling said one of said devices under test to verify the completion of said test instructions.

15. The method of claim 13, wherein said verifying comprises:
receiving an interrupt message.

16. The method of claim 13, further comprising:
generating additional test data for performing additional tests on said devices under test prior to receiving said test outcome signal from all of said dedicated testing devices.

17. The method of claim 13, further comprising:
upon receiving said test outcome signal associated with a select one of said devices under test, storing additional test data for performing additional tests on said select one of said devices under test.

18. The method of claim 17, further comprising:
generating said additional test data prior to receiving said test outcome signal.

19. The method of claim 13, wherein said test control signal includes a select one of said test instructions and said storing further includes storing remaining ones of said test instructions.

20. The method of claim 13, wherein said storing further includes:
separately storing said test data for each of said devices under test.

* * * * *

UNITED STATES PATENT AND TRADEMARK OFFICE
CERTIFICATE OF CORRECTION

PATENT NO. : 7,743,304 B2 Page 1 of 1
APPLICATION NO. : 11/357480
DATED : June 22, 2010
INVENTOR(S) : Erik H. Volkerink et al.

It is certified that error appears in the above-identified patent and that said Letters Patent is hereby corrected as shown below:

Column 12, Line 5, "150a,...150N," should read --150a, 150b...150N--.

Signed and Sealed this

Seventeenth Day of August, 2010

David J. Kappos
*Director of the United States Patent and Trademark Office*